(12) United States Patent
Nitz

(10) Patent No.: US 8,969,716 B2
(45) Date of Patent: Mar. 3, 2015

(54) PHOTOVOLTAIC DEVICE AND METHOD FOR PRODUCING A CONCENTRATOR LENS SYSTEM

(75) Inventor: Peter Nitz, Gundelfingen (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 740 days.

(21) Appl. No.: 12/737,481

(22) PCT Filed: Jul. 30, 2009

(86) PCT No.: PCT/EP2009/005549
§ 371 (c)(1),
(2), (4) Date: Mar. 31, 2011

(87) PCT Pub. No.: WO2010/012479
PCT Pub. Date: Feb. 4, 2010

(65) Prior Publication Data
US 2011/0180143 A1    Jul. 28, 2011

(30) Foreign Application Priority Data

Jul. 30, 2008 (DE) .......................... 10 2008 035 576

(51) Int. Cl.
H01L 31/00 (2006.01)
B29D 11/00 (2006.01)
F24J 2/08 (2006.01)
H01L 31/0232 (2014.01)
H01L 31/052 (2014.01)

(52) U.S. Cl.
CPC ...... B29D 11/0073 (2013.01); B29D 11/00269 (2013.01); F24J 2/085 (2013.01); H01L 31/0232 (2013.01); H01L 31/0522 (2013.01); Y02E 10/43 (2013.01); Y02E 10/52 (2013.01)
USPC .......................................... 136/259; 136/246

(58) Field of Classification Search
USPC ................................................. 136/243–265
See application file for complete search history.

(56) References Cited

U.S. PATENT DOCUMENTS

| 4,393,184 | A | * | 7/1983 | Tarumi et al. | 526/261 |
| 4,664,966 | A | * | 5/1987 | Bailey et al. | 428/203 |
| 5,191,479 | A | | 3/1993 | Tsuchida | |
| 5,228,926 | A | | 7/1993 | Glatfelter et al. | |
| 5,505,789 | A | * | 4/1996 | Fraas et al. | 136/246 |
| 6,074,290 | A | * | 6/2000 | Ko et al. | 451/390 |
| 6,733,872 | B2 | | 5/2004 | Nagai | |
| 6,809,889 | B2 | | 10/2004 | Tokuda et al. | |
| 6,855,371 | B2 | | 2/2005 | Gier et al. | |
| 2004/0123895 | A1 | | 7/2004 | Kardauskas et al. | |
| 2009/0277493 | A1 | | 11/2009 | Merkle | |
| 2010/0151207 | A1 | | 6/2010 | Hansen et al. | |

FOREIGN PATENT DOCUMENTS

| DE | 41 30 092 A1 | 10/1992 |
| DE | 100 01 135 A1 | 7/2001 |
| DE | 10 2005 01717 A1 | 10/2006 |
| DE | 10 2005 03327 A1 | 12/2006 |
| EP | 1 308 471 A2 | 5/2003 |
| EP | 1 835 547 A1 | 9/2007 |
| JP | 2006-134969 A1 | 5/2006 |

OTHER PUBLICATIONS

Chhaniwal et al., (Determination of refractive indices of biconvex lenses by use of a Michelson interferometer), Jun. 2006, Optical Society of America, vol. 45, No. 17, Applied Optics, p. 3985-3990.*
Properties of Ethylene methacrylic acid copolymer, Chemical Book, http://www.chemicalbook.com/ChemicalProductProperty_EN_CB2293808.htm.*
Bett, A.W., et al.; "The FLATCON® System from Concentrix Solar" in Luque et al, "Concentrator Photovoltaics", ISBN 978-3-540-68796-2 Springer-Verlag Berlin Heidelberg New York, 2007; Chapter 14; pp. 301-319.
Rumyantsev, V.D., et al; "Progress in Development of All-Glass Terrestrial Concentrator Modules Based on Composite Fresnel Lenses and III-V Solar Cells"; Conference Record of the 28th Institute Electrical and Electronics Engineers (IEEE), Photovoltaics Specialists Conference, Sep. 15-22, 2000; New York, NY; pp. 1169-1770.

* cited by examiner

*Primary Examiner* — Jeffrey T Barton
*Assistant Examiner* — Niki Bakhtiari
(74) *Attorney, Agent, or Firm* — Marshall & Melhorn, LLC

(57) ABSTRACT

The invention relates to a photovoltaic device for direct conversion of solar energy into electrical energy, which comprises a concentrator lens system and at least one solar cell. Furthermore the invention relates to a method for producing a concentrator lens system which can be used in a corresponding photovoltaic device but also in other devices for, e.g. thermal, use of radiation.

9 Claims, No Drawings

PHOTOVOLTAIC DEVICE AND METHOD FOR PRODUCING A CONCENTRATOR LENS SYSTEM

BACKGROUND OF THE INVENTION

The invention relates to a photovoltaic device for direct conversion of solar energy into electrical energy, which comprises a concentrator lens system and at least one solar cell. Furthermore the invention relates to a method for producing a concentrator lens system which can be used in a corresponding photovoltaic device but also in other devices for, e.g. thermal, use of radiation.

In the case of solar energy production with focusing lens systems, the solar radiation is concentrated, as a result of which a more efficient and more economical conversion of the solar energy into electrical energy is possible. An example of this is the FLATCON® system developed at the Fraunhofer ISE (A. W. Bett, H. Lerchenmüller, "The FLATCON® System from concentrix solar", in: A. Luque et al.: "Concentrator photovoltaics", 2007, pp. 301-319). The FLATCON® system is based on the fact that lens plates in which concentrating structures in the form of a large quantity of square point-focusing Fresnel lenses are applied on glass in a thin layer made of transparent silicone are used here. For this purpose, an initially liquid silicone is cured between a glass plate and a corresponding form tool which carries the desired structure of the Fresnel lenses as negative (subsequently termed negative mould) and the form tool is subsequently removed. In the FLATCON® system, lens plates produced in this way are fitted at the spacing of the focal distance of the Fresnel lenses above a base plate which is fitted with solar cells. In the case of the FLATCON® system, the focal distance is approx. twice the edge length of the individual Fresnel lenses.

Silicone offers the great advantage of astonishing durability relative to solar radiation and thermal shock load. Several years of experience in this respect show that the combination of glass (as outer cover) and silicone as structure-bearing layer leads to durable lens plates which are functional over long periods of time. In addition to other factors, the durability is not least based on the fact that the cured silicone is chemically crosslinked and the finished structure consequently has very stable viscoelastic properties. In contrast to thermoplastically shaped materials, the shape will therefore not change even over fairly long periods of time due to flowing or relaxing, as a result of which the optical function would be impaired. When using silicone as material to be embossed, disadvantages with respect to curing times and the complex production process occur. This leads to the fact that, when producing large areas or in large-scale manufacturing of lens plates, a large number of form tools is required since the dwell time during the embossing is determined by the high curing time. High specific costs respectively are associated with the requirement for a large number of embossing tools, a long processing time and a complex process implementation.

A further disadvantage when using silicone is the low refractive power which is present here. Thus the refractive index of silicones is approx. n=1.41. Correspondingly, only relatively large focal distances can be produced with representative prism angles since the reflection losses increase with large prism angles and the wavelength dispersion of light of a large spectral band width increases in an undesirable manner. In particular with respect to the costs occurring during production of the module, large focal distances are however undesired so that as small focal distances as possible are sought. In the case of a similar lens size, this requires materials with a higher refractive index if the reflection losses in the outer regions of the lenses are intended to remain low.

A further advantage of a higher refractive index resides in the fact that, with the same focal distance, the refractive structures (respectively prisms viewed in a sectional plane) become flatter. This facilitates manufacture both in the production of a tool and also in replication. In addition, the so-called disturbing edge proportion, i.e. the proportion of the projected lost area due to the optically inactive side of the prisms, reduces with flattening prisms. The higher refractive index can therefore lead to a higher optical efficiency (less disturbing edge proportions, lower reflection losses in the case of large prism angles in the outer regions of the Fresnel lens, fewer structural errors due to flatter structures) and also possibly to a more economical manufacture.

DETAILED DESCRIPTION OF THE INVENTION

Starting herefrom, it was therefore the object of the present invention to provide a photovoltaic device with a concentrator lens system which can be produced in a simple and economical manner.

This object is achieved by the method for producing a concentrator lens system having the features of claim 1 and the photovoltaic device having the features of claim 9. The further dependent claims reveal advantageous developments. A use according to the invention is described in claim 20.

According to the invention, a method for producing a concentrator lens system is provided in which there is applied on at least one surface of a substrate at least one laminating film consisting of a thermally at least partially crosslinking or crosslinkable polymer material. Subsequently, the laminating film is heated by thermal excitation at least to the softening temperature thereof, a focusing structure then being embossed in the laminating film by means of a negative mould. Curing is finally effected by at least partial crosslinking of the polymer material by means of cooling and hence formation of the stable focusing structure.

The method according to the invention, relative to the radiation-induced crosslinking processes known from microreplication, i.e. UV replication, has the advantage that a thermally induced or physical crosslinking, as is effected according to the invention, enables higher radiation stability. The radiation-crosslinking systems known from the state of the art remain constantly somewhat sensitive to radiation even after the crosslinking, which leads to accelerated degradation in the case of solar applications. This can be circumvented according to the invention.

A further essential advantage relative to the process described initially based on silicones is that the method according to the invention allows significantly shorter process times for the production of the concentrator lens system. Thus the process is concluded according to the invention just after a few minutes, whilst the methods known from the state of the art with silicones have process times of typically several hours.

Preferably ethylene vinyl acetate and/or ionomers are used as thermally crosslinking or crosslinkable polymer material.

In the case of ethylene vinyl acetate there is thereby concerned a thermally initiated crosslinking on a chemical basis which is irreversible, whilst with ionomers there is concerned a thermal crosslinking on a physical basis which is o reversible.

The thermally crosslinking ionomers are thereby selected preferably from the group consisting of ionomeric (co)polymers made of ethylene and an $\alpha,\beta$-unsaturated carboxylic acid or .a carboxylic acid anhydride of this carboxylic acid, in particular (co)polymers of ethylene and methacrylic acid. Preferably, the ionomer comprises carboxylic acid groups which are neutralised at least partially with metal ions selected from the group sodium, potassium, calcium, magnesium, zinc.

However, it is also possible here to use all polymers which can be softened by thermal excitation and crosslinked three-dimensionally by the heating or after subsequent cooling.

The materials according to the invention entail the advantage that processing by lamination is possible. They have the advantages of good and rapid processibility, tenable material costs, high transparency for solar radiation, good durability under solar radiation, high dimensional stability and good adhesion to glass or other substrates. The processing is effected in so-called laminators in which a precise sequence of temperature and pressure/vacuum is applied in optimised process times. An advantageous and preferred implementation of the production according to the invention resides accordingly in producing the concentrating structures in commercially available laminators in rapid processes which must merely be adapted easily to the altered requirements.

Furthermore, it is preferred that the focusing structure is shaped in the form of a lens plate with at least one Fresnel lens or in the form of a linearly focusing lens plate. In addition to the linear geometry, also geometries of other symmetries, e.g. a hexagonal geometry, are however possible here.

Preferably, the substrate consists of a transparent material, in particular of glass or a transparent polymer.

For reasons of durability and shape retention, even after many replication processes, the negative mould in the microreplication often is constructed in metal. With respect to the negative mould, it is important that adhesion of the negative mould to the laminating film is essentially prevented. This can be effected for example by using a metal or a metallic alloy as negative mould, the surface which is relevant for the embossing having an anti-adhesive coating. Another variant provides that the negative mould itself consists of a material which does not adhere to the laminating film, e.g. a fluorocarbon polymer or a silicone. Such form tools have in fact less strength and durability relative to metal but can also possibly be produced more easily.

According to the invention, a photovoltaic device for direct conversion of solar energy into electrical energy is likewise provided, which device has a concentrator lens system and also at least one solar cell at a spacing from the concentrator lens system. The concentrator lens system thereby has a substrate and a focusing structure which is disposed on the surface of the substrate orientated away from sunlight and made of at least one thermally crosslinked or partially crosslinked polymer.

Preferably, the focusing structure has a refractive index in the range of 1.45 to 1.60.

As thermally crosslinked or partially crosslinked polymer material, the focusing structure preferably comprises ethylene vinyl acetate and ionomers. The thermally crosslinked or partially crosslinked ionomers are thereby selected preferably from the group consisting of ionomeric (co)polymers made of ethylene and an $\alpha,\beta$-unsaturated carboxylic acid or a carboxylic acid anhydride of this carboxylic acid, in particular (co)polymers of ethylene and methacrylic acid. Preferably, the ionomer comprises carboxylic acid groups which are neutralised at least partially with metal ions selected from the group sodium, potassium, calcium, magnesium, zinc.

The focusing structure is preferably shaped in the form of a lens plate with at least one Fresnel lens or in the form of a linearly focusing lens plate. This also includes plates on which more than one lens or more than one point-focusing region are disposed adjacently or a plurality of linearly focusing structures and structure regions which are orientated parallel to each other or in another manner.

It is further preferred that the spacing between the concentrator lens system and the at least one solar cell corresponds essentially to the focal distance of the concentrator lens system. The concentrator lens system, i.e. the Fresnel lens or the linearly focusing lens plate, hence prescribes the spacing between concentrator lens system and solar cells via the focal distance. Aspect ratios (aspect ratio=[focal distance]/[typical extension of the lens], the typical extension being for example the edge lens of a square Fresnel lens or the width of a linear lens structure) are typically here in the range of 0.25-5, preferably in the range of 1-3 in the case of regular Fresnel lenses. In the case of Fresnel lenses with prisms or structures which deflect the light by means of internal total reflection (so-called TIR lenses), lower aspect ratios in the range of 0.25-2 are preferred.

If the concentrator lens system consists of a multistage concentrator lens system (i.e. a primary and a secondary lens system), then the secondary lens system can form the receiver of the concentrator lens system according to the invention. In this case, the concentrator lens system according to the invention is fitted approximately at a spacing above the entrance aperture of the secondary lens system, which spacing corresponds approximately to the focal distance of the concentrator lens system according to the invention. According to the type and design of the secondary lens system and the solar cells which are used, it can also be advantageous to change the spacing of the lens systems easily relative to each other in such a manner that it corresponds only approximately to the focal distance of the concentrator lens system.

The substrate preferably consists of a transparent material, in particular of glass or a transparent polymer. Because of the high transparency, low material costs and good weathering stability, PMMA is preferred as polymer. The transparency of the substrate is desired because the concentrator lens system is intended to concentrate the incident solar radiation as extensively as possible onto the receiver. The substrates which are used should hence have as high transparency as possible (i.e. as high as possible a degree of transmission) over as large a part as possible of the entire spectral range of the solar radiation i.e. of the wavelength range 280 nm-4,000 nm, preferably of the wavelength range 300 nm-2,500 nm. Preferably, the substrate has a degree of transmission of at least 50% at least in regions in the previously mentioned wavelength range. This takes into account the fact that polymer materials can have absorption bands in the mentioned wavelength ranges which permit merely a lower transmission.

The photovoltaic device preferably has a concentrator lens system which is producible according to the previously described method.

The photovoltaic device according to the invention has the advantage, relative to the state of the art, that the focusing structure consists of a material with a higher refractive index, as a result of which shorter focal distances of the focusing lens system can be made possible. Thus the refractive index of a typical ethylene vinyl acetate is n=1.48, that of a typical ionomer is even n=1.54.

A further advantage resides in the fact that the thermally at least partially crosslinked polymer materials used according to the invention have good compatibility with the substrate, e.g. glass, and display high long term durability and good adhesion properties even under solar radiation and the thermal shock load.

According to the invention, the use of the previously described method for producing concentrator lens systems for concentrating photovoltaics and concentrating solar power is likewise provided.

The subject according to the invention is intended to be explained in more detail with reference to the subsequent example without wishing to restrict said subject to the special embodiment shown here.

EXAMPLE 1

A glass plate which is used as substrate and on which the focusing structure is intended to be applied is placed in a PV flat module laminator. A laminating film made of ethylene vinyl acetate (EVA, e.g. Vistasolar fast cure of the company Etimex) is placed in a planar manner on the glass plate. A negative mould, i.e. the structure-bearing form tool, is placed hereon. The negative mould consists of a carrier structure made of glass with a silicone covering. In order to prevent laminating film material being expelled laterally to an undesired degree, the negative mould is sealed laterally or suitably lined. This mould replaces the composite (cell, again laminating film, rear-side film) which is otherwise situated at the top in the laminator in a PV flat module production. Subsequently, the laminator is closed and the actual lamination process is started. The lamination conditions prescribed for the material are hereby chosen based on a precisely defined temporal sequence of application of pressure/vacuum and temperature. The laminating films used according to the invention are thereby optimised to a lamination and crosslinking process which is as rapid as possible. After conclusion of the lamination, the laminate is removed and the focusing structure, i.e. the Fresnel lens structure, in the crosslinked polymer material on glass is separated from the negative mould.

The invention claimed is:

1. A photovoltaic device for direct conversion of solar energy into electrical energy, comprising a concentrator lens system and also at least one solar cell at a spacing from the concentrator lens system, the concentrator lens system having a substrate and a focusing structure which is disposed on the surface of the substrate orientated away from sunlight and made of at least one thermally crosslinked or partially crosslinked polymer material, and wherein the thermally crosslinked or partially crosslinked polymer material is selected from the group consisting of ethylene vinyl acetate and thermally crosslinked or partially crosslinked ionomers.

2. The photovoltaic device according to claim 1, wherein the focusing structure has a refractive index in the range of 1.45 to 1.60.

3. The photovoltaic device according to claim 1, wherein the thermally crosslinked or partially crosslinked ionomers are selected from the group consisting of ionomeric copolymers made of ethylene and an $\alpha,\beta$-unsaturated carboxylic acid or a carboxylic acid anhydride of this carboxylic acid, in particular ethylene methacrylic acid (co)polymers.

4. The photovoltaic device according to claim 3, wherein the ionomer comprises carboxylic acid groups which are neutralised at least partially with metal ions selected from the group sodium, potassium, calcium, magnesium, zinc.

5. The photovoltaic device according to claim 1, wherein the focusing structure in the form of at least one laminating film is disposed on the substrate.

6. The photovoltaic device according to claim 1, wherein the focusing structure is shaped in the form of a lens plate with at least one Fresnel lens or in the form of a linearly focusing lens plate.

7. The photovoltaic device according to claim 6, wherein the spacing between the concentrator lens system and the at least one solar cell corresponds essentially to the focal distance of the concentrator lens system.

8. The photovoltaic device according to claim 1, wherein the concentrator lens system comprises a primary lens system and a secondary lens system, the primary lens system being disposed at a spacing above the entrance aperture of the secondary lens system, which spacing corresponds essentially to the focal distance of the primary lens system.

9. The photovoltaic device according to claim 1, wherein the substrate consists of a transparent material, in particular of glass or a transparent polymer.

* * * * *